United States Patent [19]

Keate

[11] Patent Number: 4,833,639

[45] Date of Patent: May 23, 1989

[54] HIGH-SPEED ANALOG MULTIPLIER—ABSOLUTE VALUE DETECTOR

[75] Inventor: Christopher R. Keate, Salt Lake City, Utah

[73] Assignee: Unisys Corporation, Blue Bell, Pa.

[21] Appl. No.: 138,184

[22] Filed: Dec. 28, 1987

[51] Int. Cl.[4] .............................................. G06G 7/163
[52] U.S. Cl. ..................................... 364/841; 328/160
[58] Field of Search ..................... 307/244, 262, 571; 328/26, 160; 364/841

[56] References Cited

U.S. PATENT DOCUMENTS 3,811,098  5/1974  Williams ........................... 328/26 X
4,101,966  7/1978  Uzunoglu ............................. 364/841

Primary Examiner—Steven Mottola
Attorney, Agent, or Firm—John B. Sowell; Mark T. Starr; Thomas J. Scott

[57] ABSTRACT

A high-speed analog multiplier circuit for multiplying two analog inputs comprises a signum generator having an X input multiplier and having an output connected to a high-speed electronic switch. A Y analog input multiplicand is also connected to the high-speed electronic switch and the output of the electronic switch is connected to a differential amplifier of the type having a positive input, a negative input and a resultant output for producing the signum function (X) times Y. The electronic switch is operated by the signum generator so that the presence of a high Q output from the signum generator is effective to connect the Y multiplicand input to the positive input of the differential amplifier and that the presence of a high $\bar{Q}$ input from the signum generator is effective to connect the Y multiplicand input to the negative input of the differential amplifier.

15 Claims, 3 Drawing Sheets

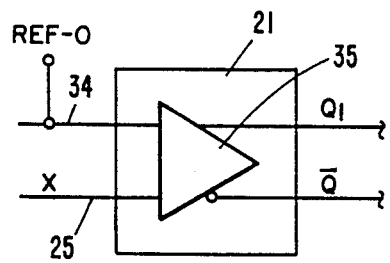
Figure 4
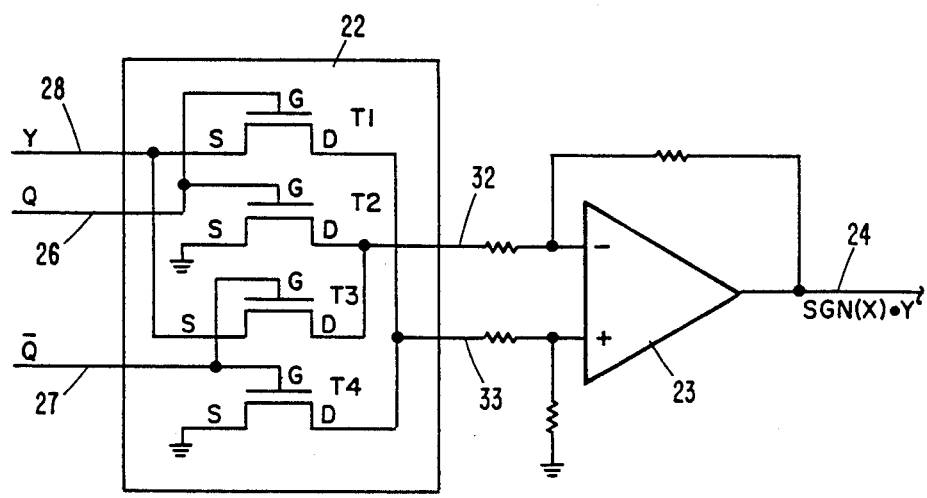
Figure 5
Figure 6

HIGH-SPEED ANALOG MULTIPLIER—ABSOLUTE VALUE DETECTOR

BACKGROUND OF THE INVENTION

1. Field of the Invention

This invention relates to high-speed analog multipliers. More particularly, this invention relates to a novel analog multiplier which employs a minimum number of high-speed logic devices for producing multiplied analog voltage results or alternatively distortion free absolute voltage values of analog inputs.

2. Description of the Prior Art

Analog multipliers are known to be relatively slow devices and heretofore have been limited to a speed of around 25 megahertz before distortion renders the output unusable.

Absolute value detectors, such as full wave bridge rectifiers, have been limited to the same range of frequencies of around 25 megahertz at the output and even then distortion is present and so that such circuits are not useful where extreme accuracy is is desired.

Absolute value detectors have been produced employing full wave rectification of an A.C. signal produced across the secondary coil of a transformer from an input signal applied to the primary coil of the transformer. While such rectifiers save at least two diodes over a full wave bridge rectifier, such devices are slower and have an output which is distorted not only by the diodes but by the inductive reactance of the transformer.

High-speed full wave rectifiers which employ diodes are limited to the operable frequency of the diodes and further are limited to the distortion characteristics or efficiency of the type of diode being employed. Presently, commercially available diodes are subject to distortion which limits their use to a level below their maximum operable frequency. It is well known that there is an accompanying DC offset when employing diodes in full wave rectifiers. Further, since diode rectifiers employ a plurality of diodes, operation of unmatched diodes at high-speed causes amplitude distortion due to imperfect balance of diodes. It is possible to manufacture diodes which can be operated at higher speeds than those which are generally commercially available. However, the distortion and DC offset will always be present when using diodes and a full wave rectifier.

It would be extremely desirable to provide a high-speed analog multiplier which is also operable as an absolute value detector or a high-speed chopper for producing distortion free output signals.

SUMMARY OF THE INVENTION

It is a principal object of the present invention to provide a high-speed analog multiplier.

It is another primary object of the present invention to provide a high-speed analog multiplier which is operable as an absolute value detector to produce absolute analog voltage values.

It is another principal object of the present invention to provide a high-speed analog multiplier which is operable as a high-speed chopper for producing distortion free chopped voltage signal outputs.

It is another object of the present invention to provide a high-speed analog multiplier whose speed of operation is only limited by the speed of operation of the semiconductor devices used to perform the switching operation.

It is another object of the present invention to provide a high-speed analog multiplier for distortion free operation in frequencies in excess of 2.5 gigahertz.

It is another object of the present invention to provide a high-speed analog multiplier operable in a chopper mode by connecting a high-speed clock to the multiplicand input and the analog voltage to be chopped to the multiplicand input to produce a high-speed chopped analog voltage output.

According to these and other objects of the present invention there is provided a high-speed analog multiplier comprising a signum generator coupled to a high-speed electronic switch having the output of the high-speed electronic switch coupled to a differential amplifier and having a second analog input to the high-speed electronic switch to produce a resultant output equal to the signum function of x times y.

BRIEF DESCRIPTION OF THE DRAWINGS

FIG. 4 is a truth table of the input signum generator shown in FIG. 3;

FIG. 5 is a ciruit diagram of the preferred embodiment signum generator;

FIG. 6 is a circuit diagram of the preferred embodiment high-speed electronic switch and differential amplifier which can be employed in the embodiment of FIG. 3.

DESCRIPTION OF THE PREFERRED EMBODIMENT

Figure 1:
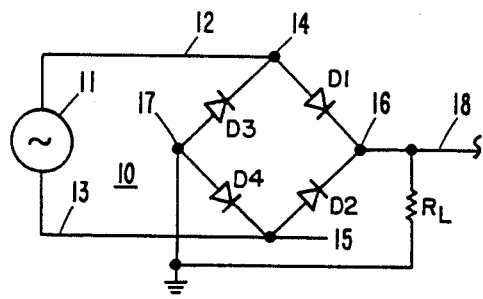
FIG. 1 is a circuit diagram of a prior art full wave diode rectifier.

Refer now to FIG. 1 showing a prior art full wave diode rectifier comprising diodes D1 through D4. An AC generator 11 is connected across input lines 12 and 13 to input points 14 and 15 of the diode bridge. The output points 16 and 17 of the diode bridge produce a DC rectified current on output line 18 across the load resistor $R_L$.

Figure 2:
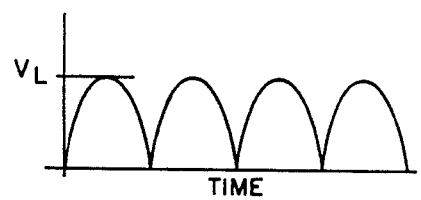
FIG. 2 is a waveform diagram of the output voltage of the rectifier of FIG. 1.

Refer now to FIG. 2 showing a DC rectified waveform which appears on output line 18 of FIG. 1. It will be noted the the negative excursion of the sinusoidal input from AC generator is inverted and appears as a positive excursion sinusoidal pulse thus producing a DC voltage $V_L$ whose absolute value is the peak of the positive and negative excursions of the sinusoidal input.

Figure 3:
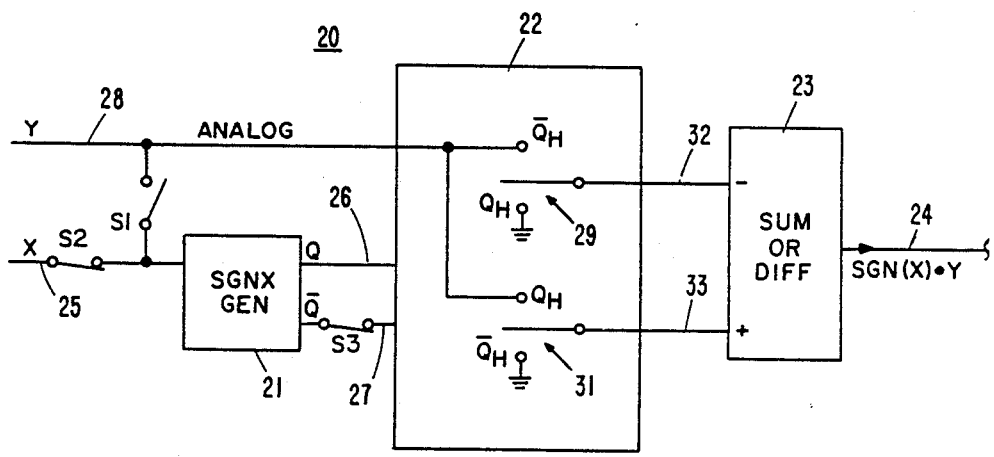
FIG. 3 is a schematic diagram of the preferred embodiment of the present invention high-speed analog multiplier.

Refer now to FIG. 3 showing a schematic block diagram of the preferred embodiment of the present invention high-speed analog multiplier 20. The multiplier 20 comprises at the input a component 21 which is a signum generator coupled to a high-speed electronic switch 22 which in turn is coupled to a difference or summing circuit 23 to produce a result or resultant sum equal to signum (X)·Y. The X input 25 is connected through a switch S2 to the input of the signum generator 21 to produce a real value Q output and an inverted value $\overline{Q}$ output on lines 26 and 27 which are connected to the electronic switch 22. The X input is discussed hereinafter as the multiplier input and a second Y analog input on line 28 is also connected to the electronic switch 22. A normally open switch S1 forms a shunt across the X and Y inputs and when closed is employed to produce the absolute value of the analog input X at the output 24 as will be explained in greater detail hereinafter. When the switch S1 is closed and the switch S2 is open, it is possible to obtain the absolute value of Y at the output 24. A switch S3 is provided in the $\overline{Q}$ output of generator 21 in order to remove the signum generator effectively from the circuit for special operations which will be discussed hereinafter.

Electronic switch means 22 is shown having electronic switches 29 and 31 with their poles in the center position. Diagramatically, the four possible values of Q are shown opposite the contacts of the switches 29 and 31 illustrating that the pole of switch 29 will be connected to the $Q_H$ contact when the $\overline{Q}$ output of generator 21 is high. Similarly, when the $\overline{Q}$ output of generator 21 is high, the pole of switch 31 is in its lower position and connected to ground. When the Q output is high, the $Q_H$ contacts are connected to the poles of the switches 29 and 31 and the switch 29 is connected to ground and the switch 31 is connected to the Y analog input on line 29. Thus, it will be understood that electronic switches making connections to either a low reference or a Y analog input voltage can be implemented and the switches can be operated by the signum generator 21 which, effectively positions the pole switches 29 and 31 to the correct input values being applied on lines 32 and 33 and to the differential amplifier 23 to produce the multiplied value sgn (X)·Y.

The novel analog high-speed multiplier is operable in an absolute value detector mode. When switch S1 is closed the output on line 24 is the sgn (X)·X or the absolute value of X. Similarly, when switch S1 is closed and switch S2 is open the output on line 24 is sgn (Y)·Y or the absolute value of Y. In another preferred mode of operation, an analog value may be applied to the input 28 as a Y analog input and a high-speed clock applied to the X input on line 25 to produce sgn (X)·Y where the square wave X produces a chopped output as will be explained in greater detail hereinafter.

Refer now to FIG. 4 showing a truth table for the signum generator 21 of FIG. 3. When the value shown as the value of X is greater than zero, the signum of X output is binary 1. When the value of X is zero, the signum of X output is also zero. However, when the value of X goes below zero and is negative, the signum of X is a binary minus one. It is well known by those skilled in the art that the truth table of FIG. 4 may be implemented in high-speed hardware.

Refer now to FIG. 5 showing a simplified embodiment circuit diagram for a signum generator 21. A reference voltage input on line 34 is applied to comparator 35. The X analog input on line 25 is applied to the second input of comparator 35 to produce the aforementioned real Q and inverted $\overline{Q}$ outputs as discussed hereinbefore with regards to FIGS. 3 and 4. The comparator 35 may be implemented with high-speed gallium arsenide transistors in several different ways with logic circuits.

Refer now to FIG. 6 showing a circuit diagram of the preferred embodiment electronic switch 22 which may be employed in the FIG. 3 embodiment. Electronic switch 22 is shown comprising field effect transistors T1, T2, T3 and T4 having source gate and drain connections. The Y input 28 is connected to the source of transistors T1 and T3. The Q output of the signum generator 21, shown as input 26 for the Q output, is connected to the gate of transistors T1 and T2. The inverted Q or $\overline{Q}$ output of signum generator 21 on line 27 is connected to the gates of transistors T3 and T4. When the value of Q on line 26 goes high, the value of $\overline{Q}$ on line 27 is automatically the reverse or low input. The high value on line 26 closes transistor T1 connecting the Y input on line 28 to line 33 connected to the plus input of the differential amplifier 23. Similarly, the high Q output on line 26 closes transistor T2 connecting the ground ot input line 32 of differential amplifier 23. In similar manner, when the $\overline{Q}$ input on line 27 goes high it closes transistors T3 and T4 connecting the Y input to the line 32 negative input of differential amplifier 23 and the ground connection of transistor T4 to the input line 33 of the positive side of differential amplifier 23.

It will be understood that transistors T1 through T4 are being switched by the input values Q and $\overline{Q}$ when the value of X is sensed as being less than or greater than zero. Thus, the transistors are being switched at the crossover nodes of the sinusoidal or analog inputs producing high-speed operations to connect the Y input on line 28 to an inverting or non-inverting differential amplifier 23 to produce an actual analog multiplication sgn (X)·Y or the absolute value of X or Y depending on the inputs. Further, it will be understood that when the X input is a square wave clock, the values of Q and $\overline{Q}$ on lines 26 and 27 are switching on the leading and trailing edges of the clock to produce a chopped output as will be explained in detail with regards to FIG. 7.

Refer now to FIGS. 7A to 7E showing waveforms of the analog voltages present at the input and output of the FIG. 3 and FIG. 6 embodiments. FIG. 7A shows a sinusoidal analog input as applied to the Y input line 28 and FIG. 7B shows a 90 degree phase shifted sinusoidal wave being applied to the X input line 25 which is identified as a cosine wave. All different types of analog input waveforms may be applied to the input lines 28 and 25 to produce the multiplied result on line 24. When the cosine input on line 25 is applied to the signum generator 21 it produces a square wave or clocked output as shown in FIG. 7C at line 26. This clock output, resulting from the phase shifted sinusoidal input on line 25, produces a chopped output on line 24 as shown in FIG. 7D. Each waveform is produced by a pulse transition. It is also possible to apply a square wave clock to line 25 at the X input to produce the same or similar chopped output on line 24 as shown in FIG. 7D.

When switch S1 is closed and switch S2 is open and the analog input Y on line 28 shown in FIG. 7A is applied, a full wave rectified output of the analog value of Y is produced at the output line 24 which is the sgn (Y)·Y or the absolute value of Y. Further, when switch S2 and S1 are both closed and the cosine value shown in FIG. 7B is applied to the X input line 25 a similar full wave rectified output will be produced on line 24 which is the sgn (X)·X which is the absolute value of X and is identical to FIG. 7E except it is phase shifted 90 degrees.

Figure 7:
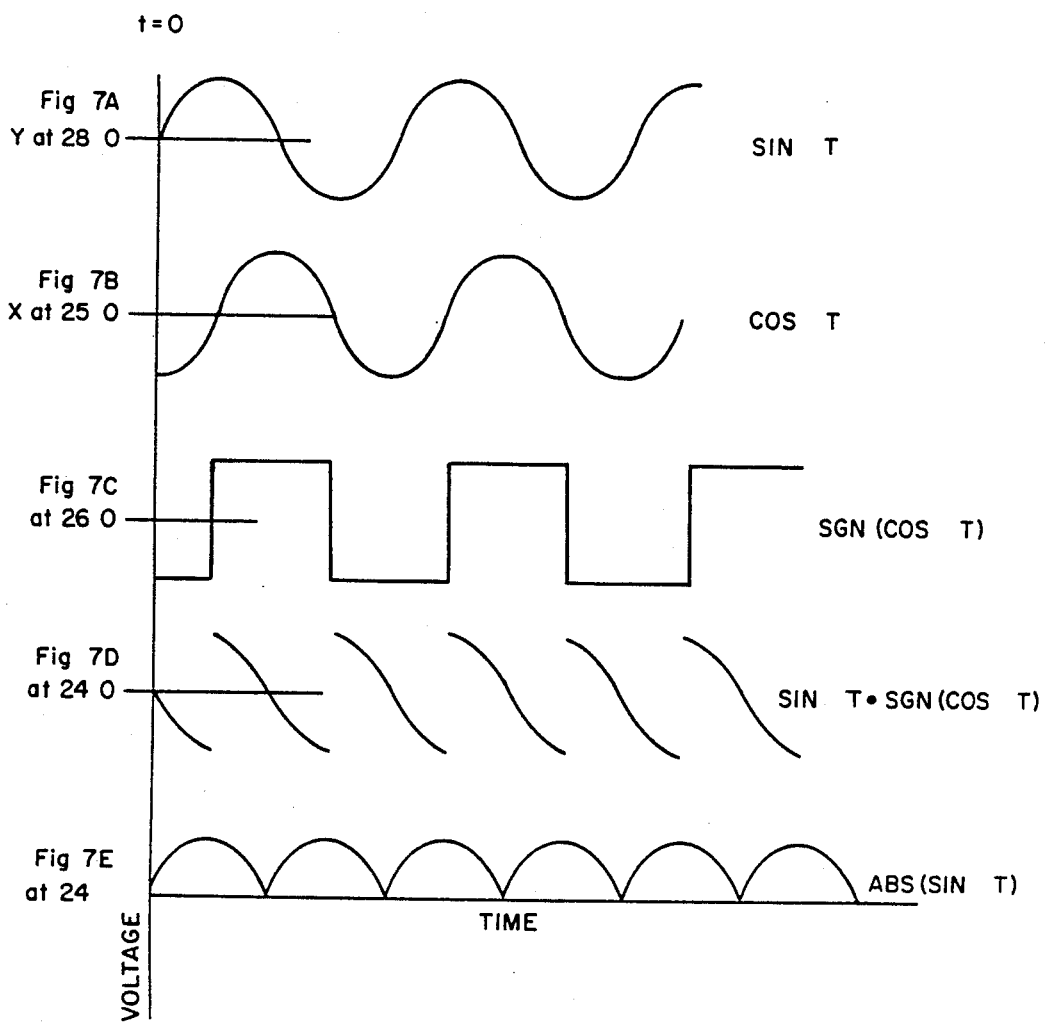
FIGS. 7A, 7B, 7C, 7D and thru 7E are a plurality of waveforms showing the analog voltages present at the input and output of the FIG. 3 preferred embodiment high-speed analog multiplier.

Having explained FIG. 7 employing sine and cosine waves, it will be appreciated that the analog inputs on the X and Y lines 25 and 28 may take any analog form. And that the multiplication resultant which occurs on output line 24 is distortion free because the switches of the electronic switch 24 only serve to perform a multiplying operation and in no way affect the vector value of the analog voltage. When employing the novel multiplier as an absolute value detector there is no diode distortion as occurs with full wave diode rectifiers nor are there any harmonics of the type associated with the operation of diodes at high-speeds so that the present invention does produce the true absolute value without distortion or DC offset.

What is claimed is:

1. A high-speed analog multiplier circuit for multiplying two inputs, comprising:
   a signum generator having an X input multiplier and a Q and a $\overline{Q}$ output,
   high-speed electronic switch means connected to said signum generator,
   a Y analog input multiplicand connected to said high-speed electronic switch means,
   amplifier means having a positive input and a negative input and a resultant output equal to the signum function of X times Y,
   said electronic switch means having a high reference output connected to the positive input of said amplifier means,
   said electronic switch means having a low reference output connected to the negative input of said amplifier means,
   so that the presence of $\overline{Q}$ when in a high state at the input of said electronic switch means connects the Y multiplicand input to the positive input and grounds the negative input of said amplifier means, and
   the presence of a $\overline{Q}$ when input at the input of said electronic switch means connects the Y multiplicand input to the negative input and grounds the positive input of said amplifier means.

2. A high-speed analog multiplier circuit as set forth in claim 1 wherein said signum generator comprises a comparator.

3. A high-speed analog multiplier circuit as set forth in claim 1 wherein said amplifier means comprises a differential amplifier.

4. A high-speed analog multiplier circuit as set forth in claim 1 which further includes means for connecting said X input to said Y input, and
   said output of of said amplifier means having an output value signum (X)·Y and is operable as an absolute value detector.

5. A high-speed analog multiplier circuit as set forth in claim 1 wherein said electronic switch means comprises a plurality of gate semiconductor switches having the gates controlled by said $\overline{Q}$ and said Q outputs from said signum generator.

6. A high-speed analog multiplier circuit as set forth in claim 5 wherein said semiconductor switches each comprise high-speed field effect transistors.

7. A high-speed analog multiplier circuit comprising:
   a differential amplifier having a negative input, a positive input and an analog resultant output,
   a first pair of transistors (T1, T4) having outputs connected together and to the positive input of said amplifier,
   a second pair of transistors (T2, T3) having outputs connected together and to the negative input of said amplifier,
   a comparator having a multiplier input (X) and a real output (Q) and an inverted output $\overline{Q}$,
   said real output (Q) being connected to a gate of one of said transistors (T1, T2) of one of each pair of said transistors (T1, T4 and T2, T3),
   said inverted output ($\overline{Q}$) being connected to a gate of other ones of said transistors (T3, T4) of each pair of said transistors,
   a multiplicand input (Y) connected to an input of one of said transistors (T1, T3) of one of each pair of said transistors (T1, T4 and T2, T3),
   a reference voltage connected to an input of other ones of said transistors (T2, T4) of each pair of transistors, and
   said multiplier circuit performing the analog multiplication of multiplier (X) times the multiplicand (Y) to produce the analog result signum (X)·Y.

8. A high-speed analog multiplier as set forth in claim 7 wherein the multiplicand input (Y) is an analog voltage input.

9. A high-speed analog multiplier as set forth in claim 7 wherein the multiplier input (X) and the multiplicand input (Y) are both analog voltage inputs.

10. A high-speed analog multiplier as set forth in claim 9 wherein said multiplier input (X) is hard wire connected to said multiplicand input (Y) and the circuit produces the analog result signum (X)·X equal to the absolute value of X.

11. A high-speed analog multiplier as set forth in claim 7 which further includes an electronic switch in series in the multiplier (X) input.

12. A high-speed analog multiplier as set forth in claim 7 which further includes an electronic switch in one of said outputs (Q, $\overline{Q}$) from said comparator.

13. A high-speed analog multiplier as set forth in claim 7 which further includes a shorting bus for connecting the multiplier input (X) to the multiplicand input (Y) of said comparator so that the output of said differential amplifier detects the absolute value of X.

14. A high-speed analog multiplier as set forth in claim 7 wherein said comparator performs a signum function output on the multiplier input (X) wherein the value of (Q) at the output is either a one (1) or a minus one (−1).

15. A high-speed analog multiplier as set forth in claim 14 wherein the value of (Q) is always one when the analog value of X is greater than zero.

* * * * *

UNITED STATES PATENT AND TRADEMARK OFFICE
CERTIFICATE OF CORRECTION

PATENT NO. : 4,833,639
DATED : 23 May 1989
INVENTOR(S) : Christopher R. Keate

It is certified that error appears in the above-identified patent and that said Letters Patent is hereby corrected as shown below:

Column 2, line 53, "the the" should read --that the--;

Column 3, line 19, "$Q_H$" should read --$\overline{Q}_H$--;

Column 3, line 26, "29" should read --28--.

Column 4, line 13, "ot" should read --of--.

Column 5, line 27, "$\overline{Q}$" should read --Q--.

Column 5, line 32, "when input" should read --when high--.

Column 4, line 68, "24" should read --22--.

Signed and Sealed this

Thirtieth Day of June, 1992

Attest:

DOUGLAS B. COMER

Attesting Officer

Acting Commissioner of Patents and Trademarks